(12) United States Patent
Jeon (10) Patent No.: US 8,031,548 B2
(45) Date of Patent: Oct. 4, 2011

(54) VOLTAGE STABILIZATION CIRCUIT AND SEMICONDUCTOR MEMORY APPARATUS USING THE SAME

(75) Inventor: Byung Deuk Jeon, Ichon (KR)

(73) Assignee: Hynix Semiconductor Inc. (KR)

( * ) Notice: Subject to any disclaimer, the term of this patent is extended or adjusted under 35 U.S.C. 154(b) by 228 days.

(21) Appl. No.: 11/962,061

(22) Filed: Dec. 20, 2007

(65) Prior Publication Data

US 2008/0279030 A1    Nov. 13, 2008

(30) Foreign Application Priority Data

May 11, 2007    (KR) .................. 10-2007-0046233

(51) Int. Cl.
*G11C 5/14* (2006.01)

(52) U.S. Cl. ......... 365/226; 365/149; 365/227; 365/229

(58) Field of Classification Search .................. 365/226, 365/189.11, 202, 206, 191, 194
See application file for complete search history.

(56) References Cited

U.S. PATENT DOCUMENTS

| 5,451,896 | A | 9/1995 | Mori | |
|---|---|---|---|---|
| 6,424,570 | B1 * | 7/2002 | Le et al. | 365/185.18 |
| 6,545,918 | B2 * | 4/2003 | Song | 365/189.11 |
| 6,724,679 | B2 * | 4/2004 | Nagasawa et al. | 365/230.03 |
| 6,928,007 | B2 * | 8/2005 | Jin | 365/194 |
| 7,095,273 | B2 * | 8/2006 | Sato et al. | 327/543 |
| 7,518,940 | B2 * | 4/2009 | Kwak | 365/229 |
| 2005/0195638 | A1 * | 9/2005 | Benzinger et al. | 365/149 |
| 2005/0213412 | A1 * | 9/2005 | Miki | 365/226 |
| 2005/0231269 | A1 | 10/2005 | Kim et al. | |
| 2006/0091938 | A1 | 5/2006 | Kim | |

FOREIGN PATENT DOCUMENTS

| KR | 1020000062549 | 10/2000 |
|---|---|---|
| KR | 1020010049689 | 6/2001 |
| KR | 1020070009255 A | 1/2007 |

\* cited by examiner

*Primary Examiner* — Pho M Luu
*Assistant Examiner* — Thao Bui
(74) *Attorney, Agent, or Firm* — Baker & McKenzie LLP (57) ABSTRACT

A voltage stabilization circuit includes a control signal generating unit to generate a control signal that is enabled when a supply voltage is unstable and a voltage level maintaining unit for selectively controlling total capacitance of a plurality of capacitors to stabilize the supply voltage in response to the control signal.

18 Claims, 5 Drawing Sheets

VOLTAGE STABILIZATION CIRCUIT AND SEMICONDUCTOR MEMORY APPARATUS USING THE SAME

CROSS-REFERENCES TO RELATED APPLICATION

The present application claims priority under 35 U.S.C. 119(a) to Korean patent application number 10-2007-0046233, filed on May 11, 2007, in the Korean Patent Office, which is incorporated by reference in its entirety as if set forth in full.

BACKGROUND

1. Technical Field

The embodiments described herein relate to a semiconductor memory apparatus, and more particularly to apparatus and methods for generating a supply voltage in a semiconductor memory apparatus.

2. Related Art

Figure 1:
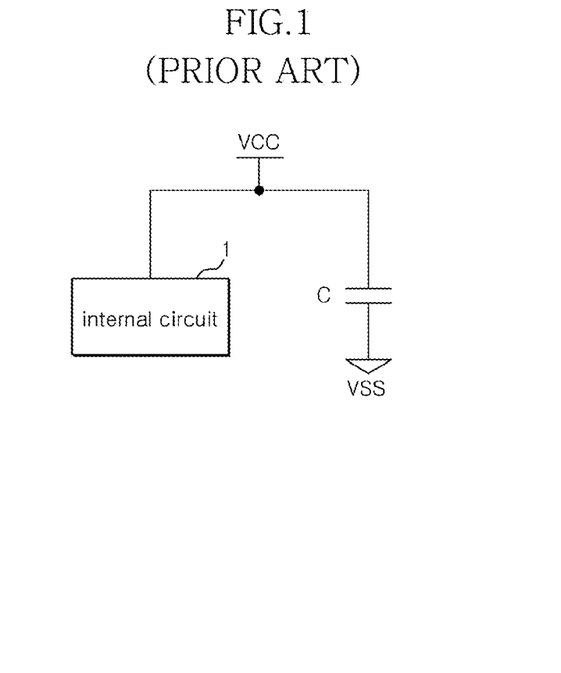
FIG. 1 is a block diagram of a conventional semiconductor memory apparatus.

As illustrated in FIG. 1, a conventional semiconductor memory apparatus includes a capacitor C to stabilize an internal circuit 1 and a supply voltage VCC applied to the internal circuit 1. When the supply voltage VCC becomes higher than a target level, the capacitor C stores heightened electric charges. Also, when the supply voltage VCC becomes lower than the target level, the capacitor C discharges the stored electric charges. In this manner, the level of the supply voltage VCC can be maintained at a constant level.

Figure 2:
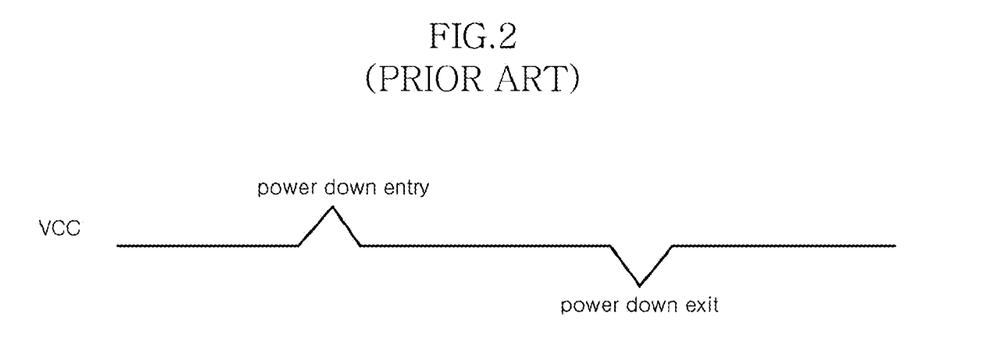
FIG. 2 is a diagram illustrating noise effecting a voltage supply in the apparatus of FIG. 1 at the time of entry into or exit from a power-down mode.

FIG. 2, however, is a diagram illustrating how noise that can effect the supply voltage VCC when the conventional semiconductor memory apparatus of FIG. 1 enters and exits from a power-down mode. For example, when a Dynamic Random Access Memory (DRAM) device enters a power-down mode, the power consumption of the DRAM device is rapidly reduced, which can cause a spike in the supply voltage VCC. Meanwhile, when the DRAM exits from the power-down mode, the power consumption of the DRAM device is rapidly increased, which can cause a dip in the supply voltage VCC.

Accordingly, when the DRAM device enters the power-down mode, the supply voltage VCC supplied to the internal circuit 1 becomes higher than the target level for a predetermined time. Meanwhile, when the DRAM exits from the power-down mode, the supply voltage VCC becomes lower than the target level for a predetermined time. Such supply voltage VCC instability is due to the small capacitance of the capacitor C provided to stabilize the supply voltage VCC.

Normal operation of the internal circuit 1 requires a stable supply voltage VCC at a target level. However, when the level of the supply voltage VCC is above or below the target level, i.e., the level of the supply voltage VCC is unstable, then normal operation of the internal circuit 1 cannot be achieved. For example, a Delay Locked Loop (DLL) circuit, in which the supply voltage VCC is provided for a DLL operation, cannot generate a normal DLL clock when the DLL operating voltage gets higher or lower than the target level. But this type of problem can effect any internal circuit that receive the supply voltage VCC buffered by the capacitor C.

SUMMARY

A voltage stabilization circuit capable of stabilizing a supply voltage to a target level at the time of entry into and exit from a power-down mode is described herein as is a semiconductor memory apparatus including the voltage stabilization circuit.

According to one aspect, there is provided a voltage stabilization circuit in a semiconductor memory apparatus comprising a control signal generating unit configured to generate a control signal that is enabled when a supply voltage is unstable, and a voltage level maintaining unit configured to selectively control total capacitance of a plurality of capacitors to stabilize the supply voltage in response to the control signal.

According to another aspect, there is provided a semiconductor memory apparatus comprising a first internal circuit to which a first supply voltage is supplied a second internal circuit to which a second supply voltage is applied and a voltage stabilization circuit for controlling total capacitance of a plurality of capacitors that are coupled to the first supply voltage and the second supply voltage to stabilize the first supply voltage at an entry into and/or an exit from a power-down mode.

These and other features, aspects, and embodiments are described below in the section entitled "Detailed Description."

BRIEF DESCRIPTION OF THE DRAWINGS

The above and other objects, features and advantages will be more apparent from the following detailed description taken in conjunction with the accompanying drawings, in which.

DETAILED DESCRIPTION

Figure 3:
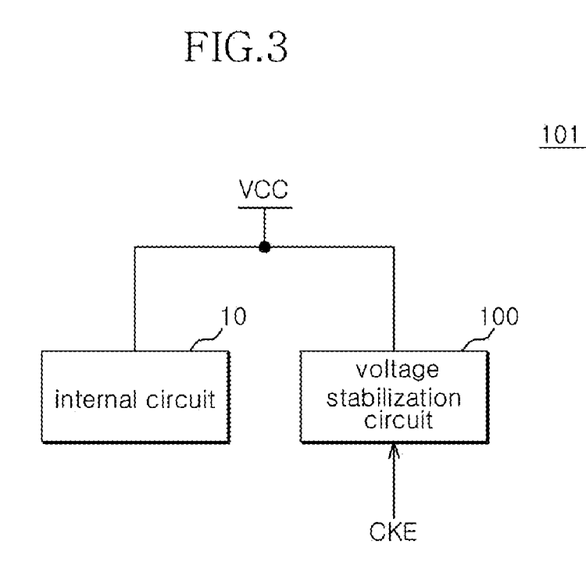
FIG. 3 is a block diagram illustrating a semiconductor memory apparatus having a voltage stabilization circuit according to one embodiment.

FIG. 3 is a diagram illustrating a semiconductor memory apparatus 101 that includes an internal circuit 10 and a voltage stabilization circuit 100 according to one embodiment. As can be seen a supply voltage VCC can be applied to the internal circuit 10. The internal circuit 10 can, e.g., represent all the circuit blocks of the semiconductor memory apparatus 101 to which the supply voltage VCC is applied.

The supply voltage VCC can also be applied to the voltage stabilization circuit 100, and the voltage stabilization circuit 100 can be configured to stabilize the supply voltage VCC to a target level. Thus, the voltage stabilization circuit can stabilize the supply voltage VCC even when the target of the supply voltage VCC is unstable, for example, when the semiconductor memory apparatus 101 enters and exits from a power-down mode in response to a clock enable signal (CKE). As with the apparatus of FIG. 1, one or more capacitors (not shown) can be coupled with the supply voltage VCC. The voltage stabilization circuit 100 can be configured to control the total capacitance of these capacitors to stabilize the supply voltage VCC e.g., at the time of entry into or exit from the power-down mode.

In the example of FIG. 1, it can be assumed that the clock enable signal (CKE) is disabled, e.g., goes low, when the semiconductor memory apparatus enters the power-down mode and is enabled, e.g., goes high, when the semiconductor memory apparatus exits from the power-down mode.

Figure 4:
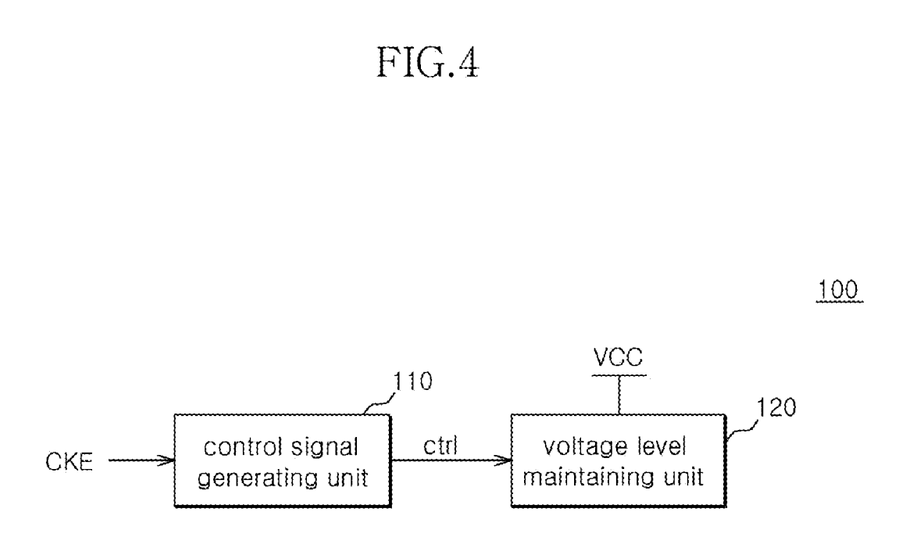
FIG. 4 is a block diagram illustrating the voltage stabilization circuit of FIG. 3 in more detail.

As illustrated in FIG. 4, the voltage stabilization circuit 100 can include a control signal generating unit 110 and a voltage level maintaining unit 120. The control signal generating unit 110 can be configured to generate a control signal (ctrl) in response to the clock enable signal (CKE). The control signal generating unit 110 can be configured to enable the control signal (ctrl) for a predetermined time after the clock enable signal (CKE) goes high, and also enable the control signal (ctrl) for a predetermined time after the clock enable signal (CKE) goes low.

Figure 5:
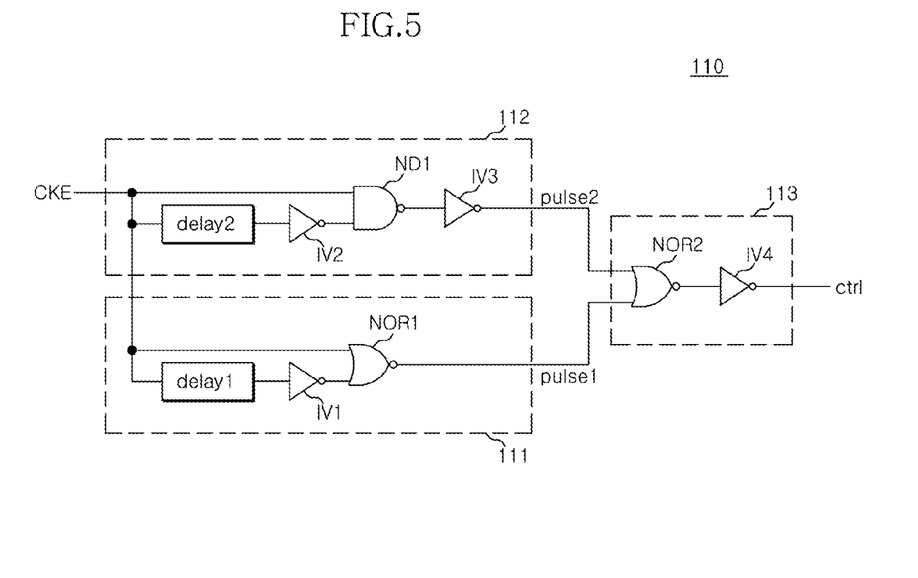
FIG. 5 is a circuit diagram of a control signal generating unit included in the circuit illustrated in FIG. 4.

As illustrated in FIG. 5, in one embodiment, the control signal generating unit 110 can include a first pulse generating unit 111, a second pulse generating unit 112 and a signal combining unit 113.

The first pulse generating unit 111 can be configured to generate a first pulse (pulse1) when the clock enable signal (CKE) goes low. The first pulse generating unit 111 can include a first inverter IV1, a first NOR gate NOR1 and a first delayer delay1. The first delayer delay1 delays the clock enable signal (CKE) for a predetermined time. The first inverter IV1 inverts an output of the first delayer delay1. The first NOR gate NOR1 generates a first pulse (pulse1) by NORing the output of the first inverter IV1 and the clock enable signal (CKE). At this time, the first NOR gate NOR1 outputs a high level signal, if both the output of first inverter IV1 and the clock enable signal (CKE) are in a low level.

The second pulse generating unit 112 can be configured to generate a second pulse (pulse2) when the clock enable signal (CKE) goes high. The second pulse generating unit 112 can include second and third inverters IV2 and IV3, a NAND gate ND1 and a second delayer delay2. The second delayer delay2 can delay the clock enable signal (CKE) for a predetermined time and the second inverter IV2 can invert an output of the second delayer delay2. The NAND gate ND1 can receive an output of the second inverter IV2 and the clock enable signal (CKE). The third inverter IV3 can output a second pulse (pulse2) by inverting an output of the NAND gate ND1.

The signal combining unit 113 generates a control signal (ctrl) based on the first pulse (pulse1) and the second pulse (pulse2). In this example, the control signal (ctrl) is enabled when the first pulse (pulse1) is enabled and is disabled when the first pulse (pulse1) is disabled. Also, the control signal (ctrl) is enabled when the second pulse (pulse2) is enabled and is disabled when the second pulse (pulse2) is disabled.

As illustrated, the signal combining unit 113 can include a second NOR gate NOR2 and a fourth inverter IV4. The second NOR gate NOR2 can perform a NOR operation on the first pulse (pulse1) and the second pulse (pulse2). The fourth inverter IV4 can output the control signal (ctrl) by inverting an output of the second NOR gate NOR2.

It should be noted that, the clock enable signal (CKE) can be configured to go low at the time of entry into the power-down mode and to go high at the time of exit from the power-down mode.

Figure 6:
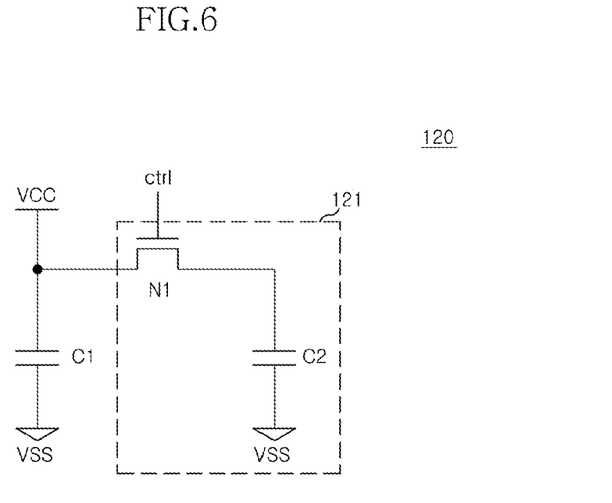
FIG. 6 is a circuit diagram of a voltage level maintaining unit included in the circuit illustrated in FIG. 4.

Referring again to FIG. 4, the voltage level maintaining unit 120 can be configured to control the plurality of capacitors used to stabilize the supply voltage VCC in response to the control signal (ctrl). For example, a plurality of capacitors can be included in the voltage level maintaining unit 120 of the voltage stabilization circuit 100 and configured to receive the supply voltage VCC as illustrated in FIG. 6. Referring to FIG. 6, the voltage level maintaining unit 120 includes a first capacitor C1 to which the supply voltage VCC is applied and a charge control unit 121. The charge control unit 121 can include a second capacitor C2 to which the supply voltage VCC is applied only when the control signal (ctrl) is enabled. In this manner, the total capacitance applied to the supply voltage VCC can be varied under the control of the control signal (ctrl)

Still referring to FIG. 6, the charge control unit 121 can include a first transistor N1 to selectively provide the supply voltage VCC to the second capacitor C2 in response to the control signal (ctrl). For example, when the first transistor N1 is a NMOS transistor, the first transistor N1 delivers the supply voltage VCC to the second capacitor C2 when the control signal (ctrl) is high.

The operations of the voltage stabilization circuit 100 will now be described in detail with reference to FIGS. 3 to 6.

First, it is assumed that the clock enable signal (CKE) is disabled, e.g., low, at the time of entry into the power-down mode and is enabled, e.g., high, at the time of exit from the power-down mode.

Thus, when the semiconductor memory apparatus 100 is not powered down, the control signal generating unit 110 will receive a high clock enable signal (CKE). At this time, the first pulse generating unit 111 outputs a low level signal as the first pulse (pulse1). Also, the second pulse generating unit 112 outputs a low level signal as the second pulse (pulse2). Therefore, the control signal (ctrl) becomes disabled, i.e., goes low.

The voltage level maintaining unit 120 receives the low level control signal (ctrl), which disables NMOS transistor N1. Therefore, the supply voltage VCC is applied to the first capacitor C1, but not applied to the second capacitor C2 because the first transistor N11 is turned off.

In power-down mode in which the clock enable signal (CKE) is disabled, i.e., low, the first pulse generating unit 111 generates the first pulse (pulse1) in a high level when the clock enable signal (CKE) goes low. The first pulse (pulse1) is enabled for a period defined by the delay time of the first delayer delay1. At this time, the second pulse (pulse2) output from the second pulse generating unit 112 is low. The first pulse (pulse1) is output as the control signal (ctrl). That is, the control signal (ctrl) goes high when the clock enable signal (CKE) goes low and has a pulse width equal to the delay time of the first delayer delay1.

Meanwhile, when the high control signal (ctrl) is received by the voltage level maintaining unit 120, the first capacitor C1 and the second capacitor C2 are connected in parallel to the supply voltage VCC by the first transistor N11, which is turned on. Thus, the supply voltage VCC, the voltage level of which becomes relatively higher when apparatus 100 enters the power-down mode, charges both the first capacitor C1 and the second capacitor C2.

When the control signal (ctrl) is disabled after a predetermined time, the supply voltage VCC is again applied to only the first capacitor C1. Also, when the power-down mode exits, that is, the clock enable signal (CKE) is high, the second pulse generating unit 112 generates the second pulse (pulse2). Thus, the control signal (ctrl) is enabled, i.e., high, when the second pulse (pulse2) is enabled for a period equal to the delay period of the second delayer delay2.

When the control signal (ctrl) of a high level is received by the voltage level maintaining unit 120, the first transistor N1 is turned on and the first capacitor C1 and the second capacitor C2 are connected in parallel with the supply voltage VCC and act in unison to stabilize the supply voltage level by discharging the voltage that has been charged therein at the time of entry into the power-down mode. When the control signal (ctrl) is then disabled, the supply voltage VCC is applied to only the first capacitor C1. The stabilization provided by capacitors C1 and C2 prevent the noise that can effect the power supply VCC e.g., when the semiconductor memory apparatus enters and exits the power down mode as illustrated in FIG. 2.

Figure 7:
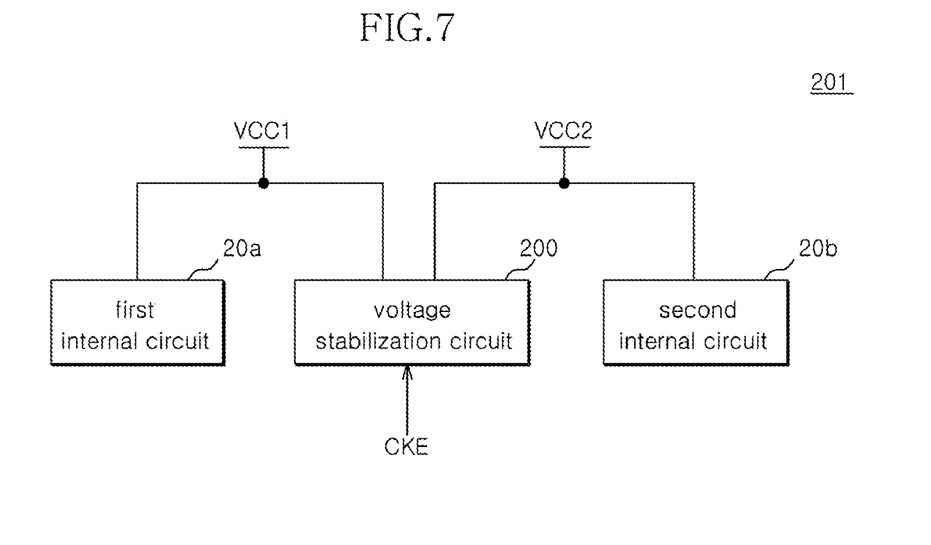
FIG. 7 is a block diagram of a semiconductor memory apparatus that include a voltage stabilization circuit according to another embodiment.

In another embodiment, as illustrated in FIG. 7, semiconductor memory apparatus 201 can include a first internal circuit 20a, supplied by a first supply voltage VCC1, a second internal circuit 20b, supplied by a second supply voltage VCC2 and a voltage stabilization circuit 200. A clock enable signal (CKE) can be received by voltage stabilization circuit 200, which can be coupled to both the first supply voltage VCC1 and the second supply voltage VCC2.

As with circuit 100, voltage stabilization circuit 200 can be configured to control the total capacitance provided to the first supply voltage VCC1 and the second supply voltage VCC2. That is, in order to stabilize the first supply voltage VCC1 at a target level, e.g., during entry into and exit from the power-down mode, the number of capacitors coupled with the first and second supply voltages VCC1 and VCC2 can be increased and decreased as needed. For example, as the number of capacitors coupled with the first supply voltage VCC1 is increased, the number of capacitors coupled with the second supply voltage VCC1 can be reduced.

Figure 8:
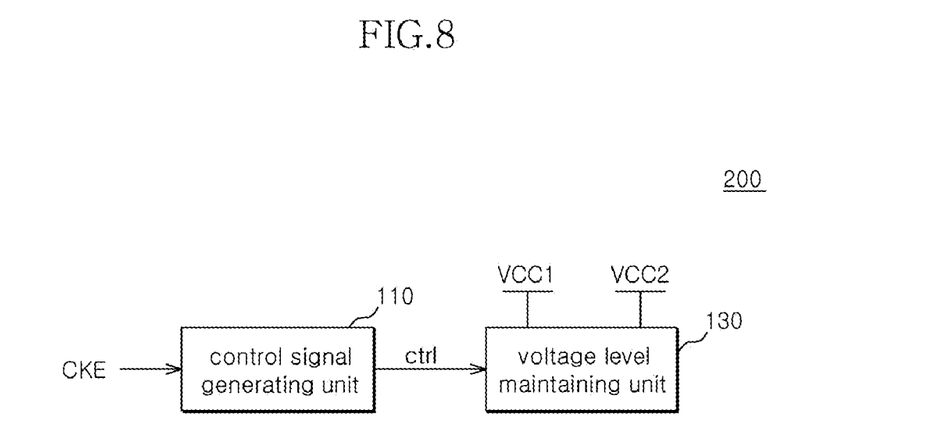
FIG. 8 is a block diagram illustrating the voltage stabilization circuit of FIG. 7 in more detail.

As illustrated in FIG. 8, the voltage stabilization circuit 200 can include a control signal generating unit 110 and a voltage level maintaining unit 130. The control signal generating unit 110 can be configured to generate a control signal (ctrl) in response to the clock enable signal (CKE). For example, the control signal generating unit 110 can be similar to the circuit illustrated in FIG. 5.

Figure 9:
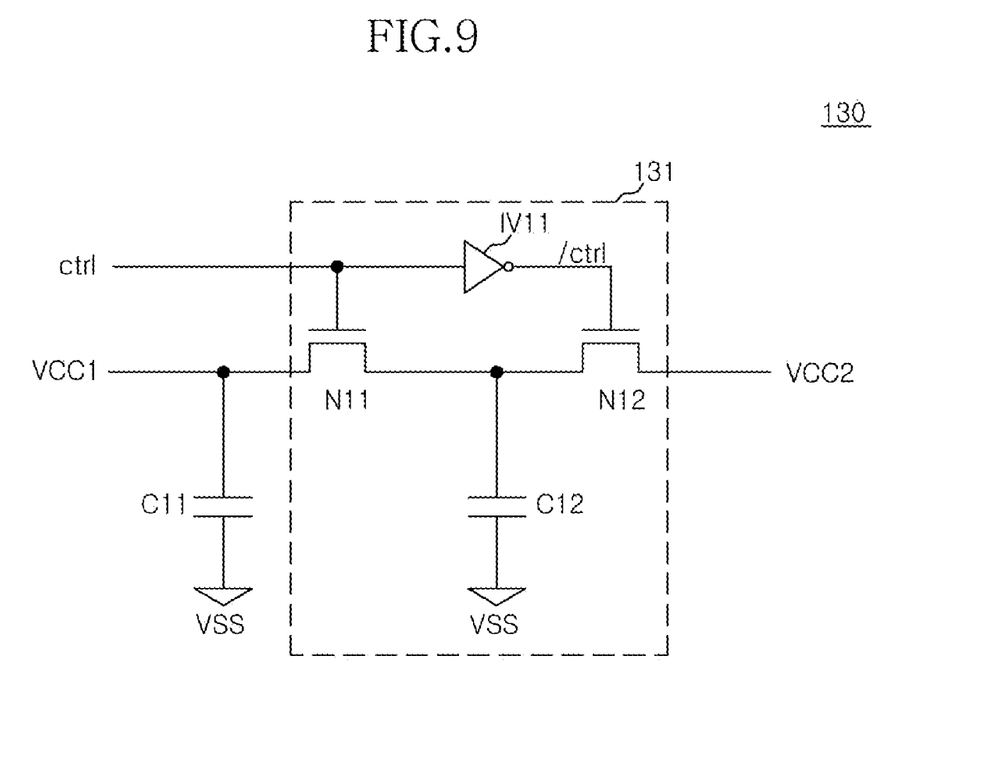
FIG. 9 is a circuit diagram of a voltage level maintaining unit included in the circuit illustrated in FIG. 8.

The first supply voltage VCC1 and the second supply voltage VCC2 are applied to the voltage level maintaining unit 130. The voltage level generating unit 130 includes a plurality of capacitors coupled with the first supply voltage VCC1 and the second supply voltage VCC2 and controls the number of capacitors coupled with the first supply voltage VCC1 and second supply voltage VCC2 based on the control signal (ctrl). As illustrated in FIG. 9, the voltage level maintaining unit 130 can be configured to increase the number of capacitors coupled with the first supply voltage VCC1 and to reduce the number of capacitors coupled with the second supply voltage VCC2 when the control signal (ctrl) is enabled, e.g., high. That is, the voltage level maintaining unit 130 can include a third capacitor C11 and a charge control unit 131. The third capacitor C11 can be coupled with the first supply voltage VCC1 regardless of the state of control signal (ctrl).

The charge control unit 131 can include a fourth capacitor C12. The fourth capacitor C12 can be coupled with the second supply voltage VCC2 when the control signal (ctrl) is disabled, i.e., low, and the fourth capacitor C12 can be coupled with the first supply voltage VCC1 only when the control signal (ctrl) is enabled. That is, when the control signal (ctrl) is disabled, the third capacitor C11 is coupled with the first supply voltage VCC1 and the fourth capacitor C12 is coupled with the second supply voltage VCC2. Meanwhile, when the control signal (ctrl) is enabled, the third capacitor C11 and fourth capacitor C12 are both coupled with the first supply voltage VCC1, and neither capacitor is coupled with the second supply voltage VCC2.

More specifically, the charge control unit 131 includes the fourth capacitor C12, switching elements, in this case NMOS transistors N11 and N12, and a fifth inverter IV11. The third capacitor C11 can be coupled between the first supply voltage VCC1 and the ground voltage VSS. One end of the fourth capacitor C11 can be connected between the second transistor N11 and the third transistor N12 and the other end can be grounded. The fifth inverter IV11 can receive the control signal (ctrl) and invert it. The second transistor N11 can couple the first supply voltage VCC1 to the fourth capacitor C12 in response to the control signal (ctrl). The third capacitor N12 can couple the second supply voltage VCC2 to the fourth capacitor C12 in response to the inverted control signal (/ctrl).

The operation of the semiconductor memory apparatus 201 will be described in detail with reference to FIGS. 5, 7, 8 and 9. First, the clock enable signal (CKE) can be at a high level when the semiconductor memory apparatus 201 is not in a power-down mode. Thus, the control signal generating unit 110 receives a high clock enable signal (CKE). At this time, the first pulse generating unit 111 outputs a low level signal as the first pulse (pulse1). Also, the second pulse generating unit 112 outputs a low level signal as the second pulse (pulse2). Thus, the control signal (ctrl) is low.

The voltage level maintaining unit 130 receives the low level control signal (ctrl) and the first supply voltage VCC1 is applied to the third capacitor C11, and the second supply voltage VCC2 is applied to the fourth capacitor C12.

At the time of entry into a power-down mode, the clock enable signal (CKE) is disabled, i.e., goes low, the first pulse generating unit 111 is enabled when the clock enable signal (CKE) transitions to a low level and generates the first pulse (pulse1), which has a pulse width equal to the delay time of the first delayer delay1. At this time, the second pulse (pulse2) output from the second pulse generating unit 112 at a low level. Thus, the first pulse (pulse1) is output as the control signal (ctrl). That is, the control signal (ctrl) goes high at the time the clock enable signal (CKE) is disabled for a period equal to the delay time of the first delayer delay1.

When the high level control signal (ctrl) is received by the voltage level maintaining unit 130, the third capacitor C11 and the fourth capacitor C12 are coupled, in parallel with the first supply voltage VCC1 via the second transistor N11, which is turned on. Therefore, the first supply voltage VCC1, the voltage level of which becomes relatively higher when apparatus 201 enters the power-down mode, charges both the third capacitor C11 and the fourth capacitor C12. When the control signal (ctrl) is disabled, i.e., low, the first supply voltage VCC1 is coupled with the third capacitor C11 and the second supply voltage VCC2 is coupled with the fourth capacitor C12 after a predetermined time by the second transistor N11, which is turned off and the third transistor N12 which is turned on.

Meanwhile, at the time of exit from the power-down mode, the clock enable signal (CKE) goes to a high level and the second pulse generating unit 112 generates a high level second pulse (pulse2). The control signal (ctrl) is enabled when the second pulse (pulse2) is enabled, and it maintains the enabled state during the delay time of the second delayer delay2.

When the control signal (ctrl) of a high level is input to the voltage level maintaining unit 130, the third capacitor C11 and the fourth capacitor C12 are connected in parallel with the first supply voltage VCC1 by the second transistor N11, which is turned on. Thus, the third and fourth capacitors C11 and C12 stabilize the first supply voltage VCC1, the level of which becomes relatively low when the power-down mode is exited. When the control signal (ctrl) is disabled in a low level after a predetermined time, the first supply voltage VCC1 is coupled with the third capacitor C11 and the second supply voltage VCC2 is coupled with the fourth capacitor C12.

The semiconductor memory apparatus having the voltage stabilization circuit according to the present invention stabilizes the supply voltage VCC applied to the internal circuit at the time of entry into and exit from a power-down mode. At the time of entry into and exit from the power-down mode, the third capacitor C11 uses the fourth capacitor C12 to which the second supply voltage VCC2 is applied in order to stabilize the first supply voltage VCC1. Of course, more capacitors can be included and more or different combinations of capacitors can be switched in and out between voltage supplies and internal circuits as required in a specific embodiment.

In the example of FIG. 7, the first internal circuit 20a can be a DLL circuit, the first supply voltage VCC1 can be a DLL operating voltage, the second internal circuit 20b can be an output driver and the second supply voltage VCC2 can be a driver operating voltage.

The voltage stabilization circuit according to the present invention has the effect of stabilizing the internal voltage of the semiconductor memory apparatus at the time of entry into, exit from or entry into and exit from the power-down mode. Also, the semiconductor memory apparatus having the voltage stabilization circuit can experience a normal operation during power down mode transitions, since the required voltage is applied at the time of entry into and exit from the power-down mode.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A voltage stabilization circuit in a semiconductor memory apparatus comprising:
   a control signal generating unit configured to generate a control signal that is enabled when a supply voltage is unstable; and
   a voltage level maintaining unit coupled with the control signal generating unit, the voltage level maintaining unit configured to selectively control an equivalent capacitance of a plurality of capacitors to stabilize the supply voltage in response to the control signal,
   wherein the supply voltage is unstable at an entry into a power-down mode or at an exit from the power-down mode, the voltage level maintaining unit electrically connects one terminal of each of the capacitors to control the equivalent capacitance when the control signal is enabled, and electrically disconnects one terminal of each of the capacitors to control the equivalent capacitance when the control signal is disabled, each other terminal of the capacitors is coupled with a ground terminal, and the control signal generating unit enables the control signal for a set time at the entry into the power-down mode and enables the control signal for the set time at the exit from the power-down mode.

2. The voltage stabilization circuit of claim 1, wherein the control signal generating unit includes:
   a first pulse generating unit configured to generate a first pulse in response to the clock enable signal at the entry into the power-down mode;
   a second pulse generating unit configured to generate a second pulse in response to the clock enable signal at the exit from the power-down mode; and
   a signal combining unit configured to output the first and second pulses as the control signal.

3. The voltage stabilization circuit of claim 2, wherein the signal combining unit is configured to generate the control signal when the first and/or second pulse is enabled.

4. The voltage stabilization circuit of claim 1, wherein the voltage level maintaining unit includes a plurality of capacitors and wherein the voltage level maintaining unit increases the number of the capacitors to stabilize the supply voltage so that the number of capacitors received to a terminal of the supply voltage is increased when the control signal is enabled.

5. The voltage stabilization circuit of claim 4, wherein the voltage level maintaining unit includes:
   a first capacitor provided with the supply voltage terminal; and
   a charge control unit having a second capacitor selectively provided with the supply voltage terminal in response to the control signal.

6. The voltage stabilization circuit of claim 5, wherein the charge control unit is configured to provide the supply voltage to the second capacitor when the control signal is enabled.

7. The voltage stabilization circuit of claim 6, wherein the charge control unit further includes a switching element configured to deliver the supply voltage to the second capacitor in response to the control signal.

8. A semiconductor memory apparatus comprising:
   a first internal circuit to which a first supply voltage is supplied;
   a second internal circuit to which a second supply voltage is applied; and
   a voltage stabilization circuit configured to control total capacitance of a plurality of capacitors that are provided with the first supply voltage and the second supply voltage to stabilize the first supply voltage at an entry into and/or an exit from a power-down mode,
   wherein the voltage stabilization circuit enables a control signal for a set time at the entry into the power-down mode, enables the control signal for the set time at the exit from the power-down mode, electrically connects one terminal of each of the capacitors to control the equivalent capacitance when the control signal is enabled and electrically disconnects one terminal of each of the capacitors to control the equivalent capacitance when the control signal is disabled, and each other terminal of the capacitors is coupled with a ground terminal.

9. The semiconductor memory apparatus of claim 8, wherein the voltage stabilization circuit is configured to increase the number of the capacitors provided with the first supply voltage and reduce the number of the capacitors provided with the second supply voltage at the entry into and/or the exit from the power-down mode.

10. The semiconductor memory apparatus of claim 8, wherein the voltage stabilization circuit comprises:
    a control signal generating unit configured to generate a control signal at the entry into and/or the exit from the power-down mode; and
    a voltage level maintaining unit configured to control the number of the capacitors provided with the first supply voltage and the second supply voltage in response to the control signal.

11. The semiconductor memory apparatus of claim 10, wherein the control signal is configured to generate a pulse at the entry into the power-down mode and outputs the pulse as the control signal.

12. The semiconductor memory apparatus of claim 11, wherein the control signal generating unit includes a pulse generating unit configured to generate the pulse when a clock enable signal goes low.

13. The semiconductor memory apparatus of claim 10, wherein the control signal generating unit configured to generate a pulse and output the pulse as the control signal when the power-down mode exits.

14. The semiconductor memory apparatus of claim 13, wherein the control signal generating unit includes a pulse generating unit configured to generate the pulse when a clock enable signal goes high.

15. The semiconductor memory apparatus of claim 10, wherein the control signal generating unit includes:
- a first pulse generating unit configured to generate the first pulse when a clock enable signal goes low;
- a second pulse generating unit configured to generate the second pulse when the clock enable signal goes high; and
- a signal combining unit configured to receive the first pulse and the second pulse to output the control signal.

16. The semiconductor memory apparatus of claim 10, wherein the voltage level maintaining unit includes:
- a charge control unit having a first capacitor provided with the first supply voltage; and
- a second capacitor provided with the first supply voltage or the second supply voltage in response to the control signal.

17. The semiconductor memory apparatus of claim 16, wherein the charge control unit includes a second capacitor provided with the first supply voltage when the control signal is enabled and provided with the second supply voltage when the control signal is disabled.

18. The semiconductor memory apparatus of claim 17, wherein the charge control unit includes:
- a first switching element configured to provide the second capacitor with the first supply voltage in response to the control signal; and
- a second switching element configured to provide the second capacitor with the second supply voltage in response to the control signal.

* * * * *